United States Patent
Keshavarzi et al.

(10) Patent No.: US 6,683,467 B1
(45) Date of Patent: Jan. 27, 2004

(54) METHOD AND APPARATUS FOR PROVIDING ROTATIONAL BURN-IN STRESS TESTING

(75) Inventors: Ali Keshavarzi, Portland, OR (US); David M. Wu, Austin, TX (US); Yibin Ye, Hillsboro, OR (US); Vivek K. De, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 449 days.

(21) Appl. No.: 09/672,689

(22) Filed: Sep. 29, 2000

(51) Int. Cl.$^7$ ............................................... G01R 31/02
(52) U.S. Cl. .................... 324/760; 324/158.1
(58) Field of Search ................. 324/760, 761, 324/762, 763, 764, 765, 158.1; 438/14, 15, 16, 17, 18

(56) References Cited

U.S. PATENT DOCUMENTS

| | | | |
|---|---|---|---|
| 4,956,602 A | * 9/1990 | Parrish | 324/537 |
| 4,961,053 A | * 10/1990 | Krug | 324/537 |
| 5,432,745 A | * 7/1995 | Tomita et al. | 365/201 |
| 5,638,331 A | 6/1997 | Cha et al. | |
| 5,656,944 A | 8/1997 | Choi | |
| 5,798,653 A | 8/1998 | Leung, Jr. | |
| 5,804,960 A | * 9/1998 | El Ayat et al. | 324/158.1 |
| 5,838,203 A | 11/1998 | Stamoulis et al. | |
| 5,949,726 A | 9/1999 | Tseng et al. | |
| 6,229,329 B1 | * 5/2001 | Nakata et al. | 324/765 |

FOREIGN PATENT DOCUMENTS

WO     9935579     7/1999

OTHER PUBLICATIONS

Banikazemi et al., "Comparison and Evaluation of Design Choices for Implementing the Virtual Interface Architecture (VIA)", Lecture Notes in Computer Science, Springer Verlag, New York, NY, pp. 145–161, vol. 1797, 2000.

Eicken et al., "Evolution of the Virtual Interface Architecture", Computer, IEEE Computer Society, Long Beach, CA, vol. 31, No. 11, Nov. 1998, pp. 61–68.

Dunning et al., "The Virtual Interface Architecture", IEEE Micro, IEEE Inc., New York, NY, vol. 18, No. 2, Mar. 1998, pp. 66–76.

* cited by examiner

Primary Examiner—Kamand Cuneo
Assistant Examiner—Tung X. Nguyen
(74) Attorney, Agent, or Firm—Schwegman, Lundberg, Woessner & Kluth, P.A.

(57) ABSTRACT

A method and device are provided for stress testing a chip. The chip may be partitioned into at least a first block and a second block. Burn-in stress testing may be performed on electronic devices within the first block without simultaneously performing burn-in stress testing on electronic devices within the second block. A burn-in stress testing device may perform the burn-in testing. A control device may be coupled to the burn-in stress testing device to enable burn-in stress testing on electronic devices within at least the first block of the chip without simultaneously enabling burn-in stress testing on the second block of the chip.

24 Claims, 4 Drawing Sheets

US 6,683,467 B1

METHOD AND APPARATUS FOR PROVIDING ROTATIONAL BURN-IN STRESS TESTING

FIELD

The present invention relates to semiconductor integrated circuit testing and more particularly relates to burn-in testing of semiconductor integrated circuit devices.

BACKGROUND

After semiconductor devices are produced, a screening and testing operation may be performed to detect and remove defective electronic devices to ensure the overall quality of the devices. In one such screening operation, a burn-in stress test may be executed that involves both field acceleration and temperature acceleration. During burn-in stress testing, the device may be operated in a state where the voltage and temperature of the test are set much higher than the normal operating voltage and temperature of the device. A stress voltage higher than that which frequently causes initial failure during normal operation may be applied to the device for a period of time. As a result, a defective device may be removed from production. Without burn-in testing, this defective device might have not been detected until the device's initial operation.

The burn-in testing stresses chips through elevation of temperature and voltage and induces weak devices and other structures to fail prior to being released to the field. An objective of stress testing is to identify defective devices at the earliest part of the fabrication process. However, as technology scales, there has been a need to reduce the power supply voltage of chips. Reducing the power supply voltage of chips while maintaining the same threshold voltage for transistors on the chip may degrade the performance of the chip. As such, if the power supply voltage and the threshold voltages are reduced, then leakage current on the chip increases. Leakage current is a major problem that causes a barrier to scaling technology. This problem is more pronounced at burn-in because of the elevated temperature and voltage. It is desirable to deal with burn-in technology without causing leakage current problems in order to screen scaled integrated circuits having increased speeds.

BRIEF DESCRIPTION OF THE DRAWINGS

The foregoing and a better understanding of the present invention will become apparent from the following detailed description of example embodiments and the claims when read in connection with the accompanying drawings, all forming a part of the disclosure of this invention. While the foregoing and following written and illustrated disclosure focuses on disclosing example embodiments of the invention, it should be clearly understood that the same is by way of illustration and example only and the invention is not limited thereto.

The following represents brief descriptions of the drawings in which like reference numerals represent like elements and wherein.

DETAILED DESCRIPTION

Figure 1:
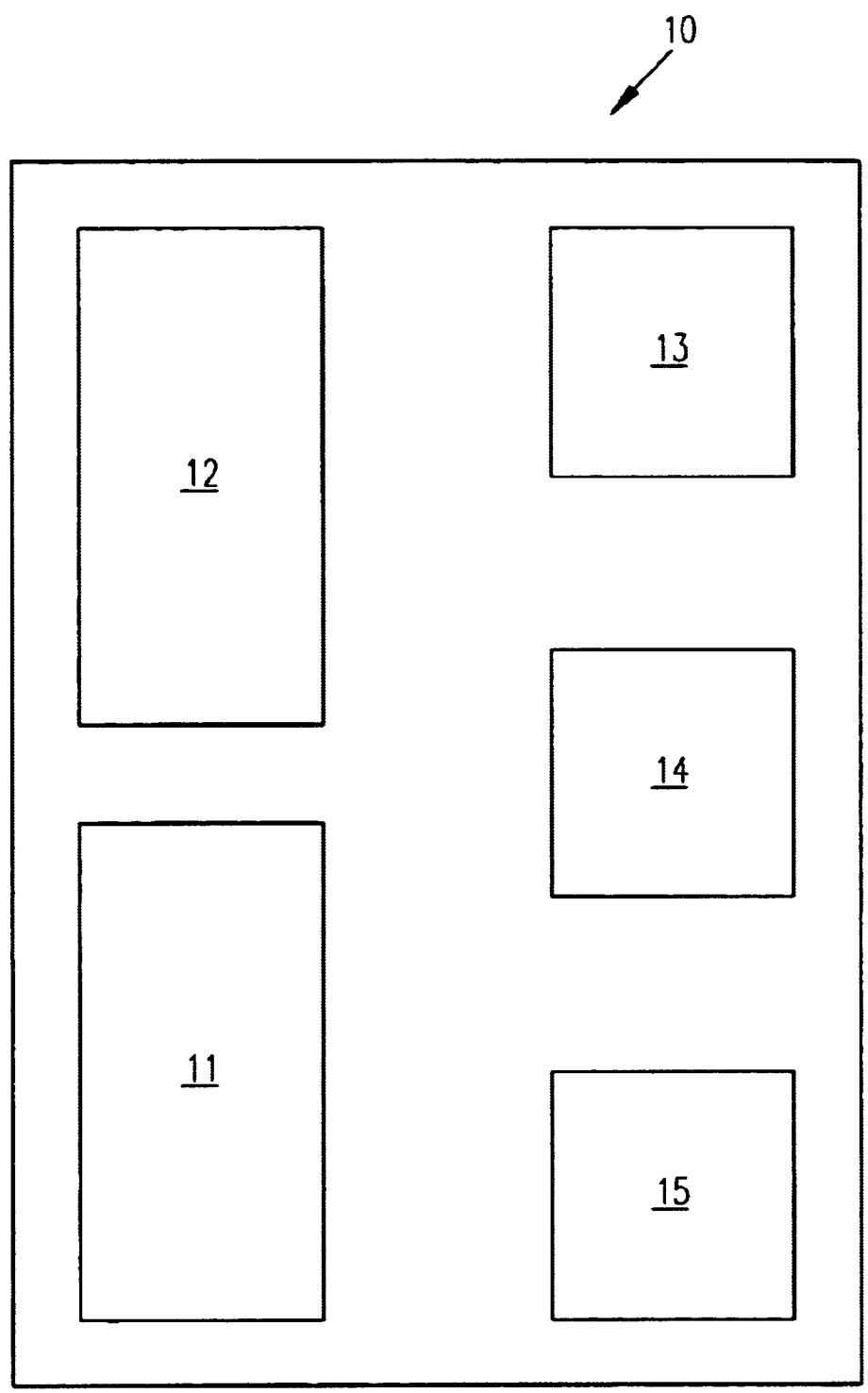
FIG. 1 illustrates a chip partitioned into a plurality of blocks according to an example embodiment of the present invention.

Before beginning a detailed description of the subject invention, mention of the following is in order. When appropriate like reference numerals and characters may be used to designate identical, corresponding or similar components in differing figure drawings. Further, in the detailed description to follow, example sizes/models/values/ranges may be given although the present invention is not limited to the same. With regard to the description of any timing signals, such terms may be used to avoid confusion when working with a mixture of "active-low" and "active-high" signals, and to represent the fact that the invention is not limited to the illustrated/described signals, but could be implemented with a total/partial reversal of any of the "active-low" and "active-high" signals by a simple change in logic. Additionally, well known power/ground connections to ICs and other components may not be shown within the FIGS. for simplicity of illustration and discussion. Further, arrangements may be shown in block diagram form in order to avoid obscuring the invention, and also in view of the fact that specifics with respect to implementation of such block diagram arrangements may be dependent upon the platform within which the present invention is to be implemented, i.e., the specifics are well within the purview of one skilled in the art. Where specific details (e.g., circuits, flowcharts) are set forth in order to describe example embodiments of the invention, it should be apparent to one skilled in the art that the invention can be practiced without these specific details. Finally, it should be apparent that any combination of hard-wired circuitry and software instructions can be used to implement embodiments of the present invention. That is, the present invention is not limited to any specific combination of hardware circuitry and software instructions.

One issue for scaled process technologies and in high performance integrated circuits is elevated leakage current, including transistor and gate oxide leakage. Leakage current and its contribution to leakage power contribute to a chip's overall total power. Leakage problems become worse at burn-in conditions such as at a higher voltage and temperature. As stated above, burn-in stress testing may be incorporated and optimized to improve the quality and reliability of integrated circuits. Elevated leakage may cause concern for managing thermal issues at burn-in stress testing including power management.

In burn-in, packaged integrated circuits may be stressed under elevated voltage and conditions to accelerate early failures. Burn-in may be a batch process where as many as a few hundred of assembled (i.e., packaged) units may be simultaneously stressed at elevated temperatures and voltages in order to accelerate latent reliability defects and processing problems to failure. Burn-in time (or duration) may be a function of many variables including the outgoing failure rate, yield, die size, voltage and junction temperature. The outgoing failure rate may be defined by corporate policy (and a company's desired quality level) while yield and die size are process and product attributes, respectively. Voltage and temperature may be manipulated from a manufacturing process standpoint.

Embodiments of the present invention may partition a chip into a plurality of functional blocks such as a first block and a second block. Burn-in stress testing may then be performed on electronic devices within the first block and not simultaneously be performed on electronic devices within the second block. After performing the burn-in stress testing on the electronic devices within the first block, the burn-in stress testing may be subsequently performed on the electronic devices within the second block.

The present invention will now be described with respect to the accompanying figures. FIG. 1 illustrates a chip that may include a large number of fabricated electronic devices such as transistors. The electronic devices are not shown for ease of illustration. In accordance with embodiments of the present invention, the chip 10 may be partitioned (i.e., divided or segmented) into a plurality of functional blocks such as block 11, block 12, block 13, block 14 and block 15. Each block may be considered a separate functional logical block. That is, the chip may be partitioned based on the different functionalities such as being divided to separate memory devices and logic devices. Each of the blocks 11–15 may surround a plurality of electronic devices on the chip capable of operating (i.e., functioning) on their own such that each block surrounds a self-contained system.

The partitioning (or dividing) of the chip into a plurality of blocks may be performed manually (such as by the chip designer), by a processor or other similar type of device capable of properly partitioning the chip or by any combination thereof. The block boundaries or the concept of partitioning may merely involve dividing the chip between core and cache areas or into more subcircuit building blocks.

After partitioning the chip, embodiments of the present invention may perform burn-in stress testing on a block by block basis. That is, burn-in stress testing may be performed on a block level rather than being performed on the entire chip at one time. In other words, burn-in stress testing may be performed on a first block, then on a second block, then on a third block, then on a fourth block, etc.

Figure 2:
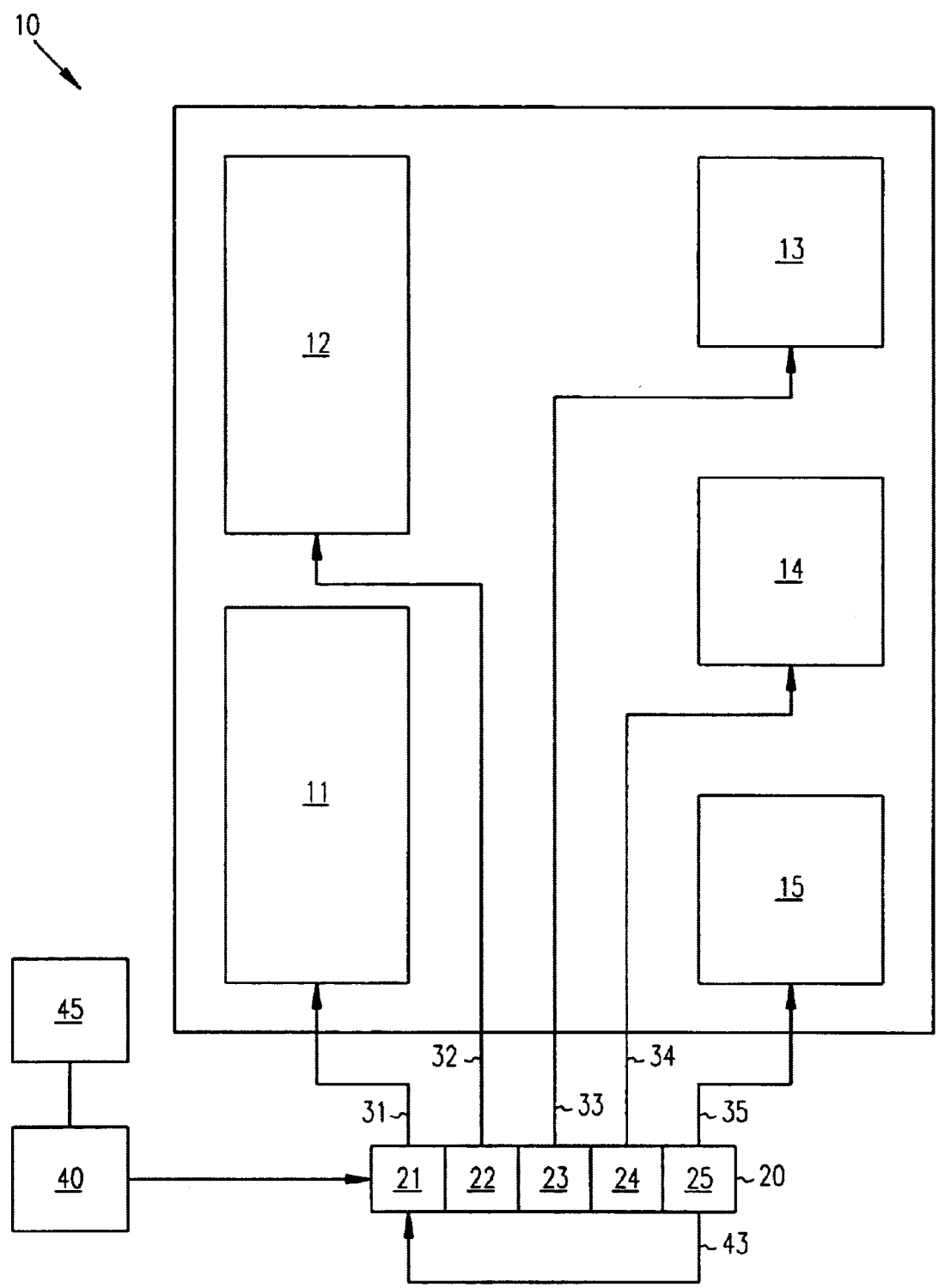
FIG. 2 illustrates the chip shown in FIG. 1 and additional blocks for performing burn-in stress testing according to an example embodiment of the present invention.

FIG. 2 shows the chip 10, a control device 40, a burn-in stress testing device 45 and a shift register 20 such as a loop back linear feedback shift register as will be described below. The shift register 20 may be considered part of the control device 40 or it may be considered a entity separate from the control device 40. Both configurations are considered part of the present invention. The control device 40, the burn-in stress testing device 45 and the shift resistor 20 operate to control whether each of the respective blocks 11–15 is active or inactive. An active block corresponds to a block that will have burn-in performed on the electronic devices and circuits within it while an inactive block corresponds to a block that will not have burn-in performed on the electronic devices within it at that time period. Inactive blocks may subsequently have burn-in performed on the electronic devices within its boundaries or those electronic devices may have already had burn-in previously performed on them.

In one example embodiment, only one of the functional blocks will be active at a time while each of the remaining blocks will be inactive. In another example embodiment, more than one block will be active at a time and at least one block will be inactive. This may be done due to leakage management requirements, burn-in test duration, thermal management, or power supply issues.

The burn-in stress testing device 45 may be coupled to each of the respective blocks 11–15 and operate to perform burn-in stress testing only on the active blocks while not simultaneously performing burn-in stress testing on the inactive blocks. FIG. 2 shows one example embodiment for performing burn-in stress testing according to the present invention. Other embodiments and configurations are also within the scope of the present invention.

As shown in FIG. 2, the shift register 20 may be a loop back linear feedback shift register having at least registers 21–25. Each of the registers 21–25 may be separately coupled to one of the blocks 11–15. For example, the register 21 may be coupled to block 11 by a signal line 31. The register 22 may be coupled to the block 12 by a signal line 32. The register 23 may be coupled to the block 13 by a signal line 33. The register 24 may be coupled to the block 14 by a signal line 34 and the register 25 may be coupled to the block 15 by a signal line 35. A signal line 43 may also couple the register 25 to the register 21. The control device 40 may be coupled to the shift register 20 by a signal line 42. The shift register 20 may be operated based on a signal applied across the signal line 42 from the control device 40 or other similar type of device. The control device 40 may include any logic circuit block or control block, such as a processor, to perform various functions such as controlling the burn-in stress testing device 45 and the shift register 20.

The shift register 20 may operate such that each of the registers shifts its value one to its right when a signal (hereafter called a clock signal) is applied along the signal line 42 from the control device 40. For example, upon receiving the clock signal, the value within register 21 may be shifted to the register 22, the value within the register 22 may be shifted to the register 23, the value within the register 23 may be shifted to the register 24, the value within the register 24 may be shifted to the register 25 and the value within the register 25 may be output along the signal line 43 and input to the register 21. The values within each of the registers 21–25 may also be transmitted to the blocks 11–15 along the signal lines 31–35, respectively. According to the FIG. 2 embodiment, each block may be enabled (or made active) by the shift register 20 operating under control of the control device 40. That is, a "1" bit in the register 21 may cause the block 11 to be active, thus signifying that it will be subjected to burn-in stress testing during that time period. A "0" bit in the register 21 may cause the block 11 to be inactive, thus signifying that it will not be subjected to burn-in testing at that time period. The controlling bits of the shift register 20 may be initially scanned into the shift register with the location of "1(s)" corresponding to blocks to be burn-in stressed at a particular rotation and the location of "0(s)" corresponding to blocks that will not be burn-in stressed at that particular rotation. Burn-in stress testing may be subsequently enabled by the control device 40 and the burn-in stress testing device 45 for a predetermined period of time. Subsequent to the first stage of the burn-in stress testing, the bits within the shift register 20 may be shifted one bit to the right as discussed above and the process may be repeated. This operation may be repeated until all the blocks 11–15 have been properly tested.

Figure 3:
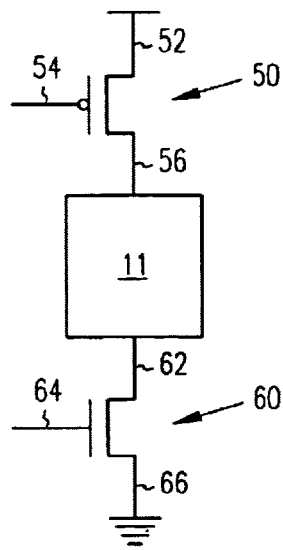
FIG. 3 illustrates sleeping transistors coupled around one partitioned block according to an example embodiment of the present invention.

Embodiments of the present invention may use a mechanism, such as sleeping transistors, to cut off (or decrease) the leakage current through inactive blocks. That is, inactive blocks may be put to sleep (i.e., a leakage current reduction technique) by turning OFF sleeping transistors for that block which in turn decreases the leakage current through the block and hence improves burn-in thermal and power requirements. FIG. 3 shows one example embodiment of how sleeping transistors may be used to reduce the leakage current through an inactive block. Other embodiments and configurations for reducing leakage current of a particular block are also within the scope of the present invention.

FIG. 3 shows the block 11 coupled between a PMOS transistor 50 and an NMOS transistor 60. The PMOS transistor 50 and the NMOS transistor 60 may act as sleeping transistors to reduce the leakage current through the block 11 by a stack forcing mechanism when the transistors are OFF. As shown in FIG. 3, the PMOS transistor 50 includes a drain 52 that may be coupled to the actual supply voltage (VDD), a source 56 coupled to the block 11 (referred to as virtual VDD) and a gate 54. The NMOS transistor 60 includes a drain 62 coupled to the block 11 (referred to as virtual VSS or ground), a source 66 coupled to ground (VSS) and a gate 64. This configuration of the NMOS transistor 60 and the PMOS transistor 50 acting as sleeping transistors may be provided for each of the blocks 11–15 on the chip 10. That is, a first set of PMOS and NMOS transistors may be coupled around block 11, a second set of NMOS and PMOS transistors (not shown) may be coupled around block 12, a third set of NMOS and PMOS transistors (not shown) may be coupled around block 13, a fourth set of NMOS and PMOS (not shown) transistors may be coupled around block 14 and a fifth set of NMOS and PMOS transistors (not shown) may be coupled around block 15.

Each set of NMOS and PMOS transistors around a particular block may be separately (or independently) controlled by a signal output from one of the registers. This signal may then pass through a logic circuit prior to being input to one of the NMOS or PMOS transistors. The signal to control the ON/OFF status of the first set of NMOS and PMOS transistors for the block 11 may be output from register 21 and pass through any required logic circuits to the gate 54 and the gate 64. Likewise, the signal to control the ON/OFF status of the second set of NMOS and PMOS transistors may be output from the register 22 along the signal line 32 and pass through any required logic circuits to the respective gates of the second set of transistors for block 12. The signal to control the ON/OFF status of the third set of NMOS and PMOS transistors may be output from the register 23 along the signal line 33 and pass through any required logic circuits to the gates of the third set of transistors for block 13. Similarly, the signals to control the ON/OFF status of the third set of NMOS and PMOS transistors may be output from the register 24 along the signal line 34 and pass through any required logic circuits to the gates of the fourth set of transistors for block 14. Finally, the signal to activate/deactivate the fourth set of NMOS and PMOS transistors may be output from the register 25 along the signal line 35 to the gates of the fifth set of transistors for block 15. In such a manner, the signals output from the shift register 20 may control whether each of the sleeping transistors around a particular block are ON or OFF. When a block will be subjected to burn-in, then the transistors coupled around that block may be switched ON. The blocks that will not be subjected to burn-in during that time period will have their respective transistors coupled around that block in an OFF state. When the transistors are OFF, they act to reduce the leakage current through the electronic devices within the inactive block that they surround. In the embodiment shown in FIG. 3, a high ("1") signal activates the NMOS transistor 60 while a low ("0") signal activates the PMOS transistor 50. As such, the signal output from register 21 may pass through an invertor circuit along the signal line 31 prior to being input into the PMOS transistor 50. The same may apply to the other signals output from the registers to the respective transistors. As a further alternative, two shift registers may be used where the first shift register applies a signal to the NMOS transistor for each block while the second shift register applies a signal to the PMOS transistor for each block.

Figure 4:
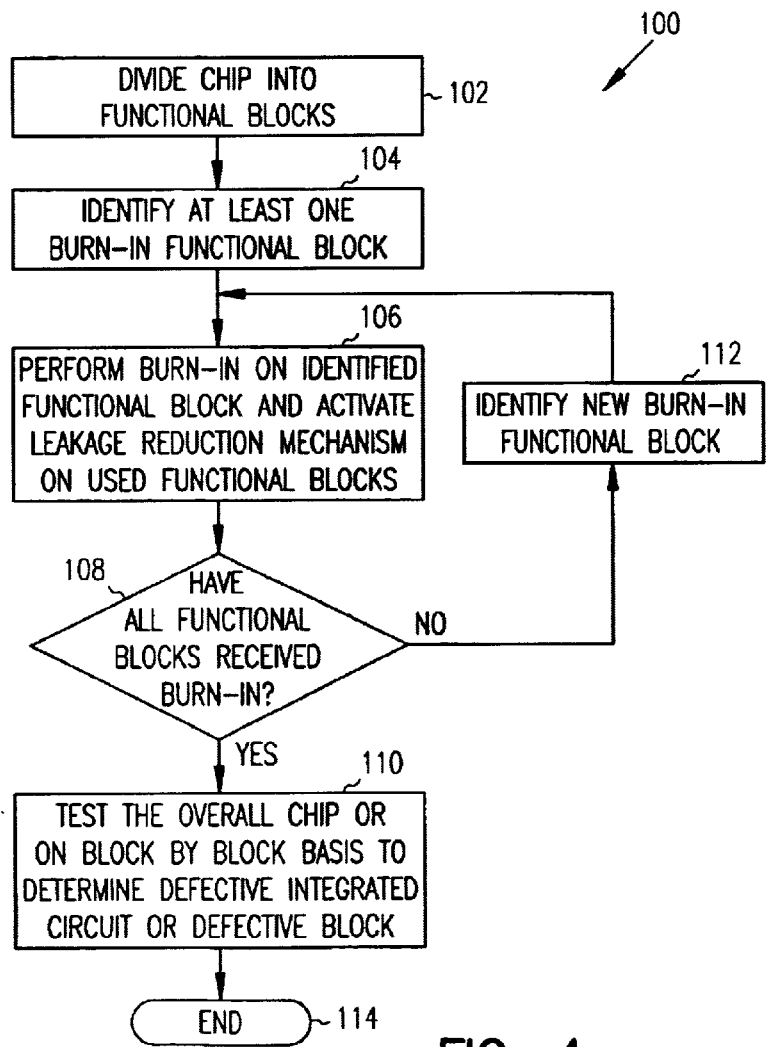
FIG. 4 is a flowchart illustrating operations according to an example embodiment of the present invention.

FIG. 4 illustrates a flowchart showing operations according to an example embodiment of the present invention. Other embodiments and other orders of operations are also within the scope of the present invention. In operation 102, the chip may be partitioned (or divided) into different functional blocks such as blocks 11–15. In operation 104, at least one of the blocks may be identified for burn-in stress testing. In operation 106, burn-in may be performed on the identified block and the leakage reduction mechanism may be activated on the unused blocks. In operation 108, a determination is made whether all of the functional blocks have received burn-in. If all the functional blocks have not received burn-in, then at least one new functional block may be identified for burn-in in operation 112. Operations 106 and 108 may be repeated until all the functional blocks have received burn-in. If operation 108 results in an affirmative answer, then in operation 110, the overall chip may be tested or the chip may be tested on a block by block basis to determine defective integrated circuits or defective blocks. Any defective functional blocks may be identified based on the testing and those components may be discarded. It is understood that the operation may end in operation 114. Operation 110 may occur at any time subsequent to performing burn-in on a functional block of the chip. That is, the present invention is not limited to operation 110 occurring after operation 108. As an alternative, each block may be tested following burn-in stressing or during the burn-in stressing for that block. In other words, each block may be stressed and tested before advancing to a further block.

According to the above description, embodiments of the present invention may partition a chip into first and second blocks. Electronic devices within one block may be made active for burn-in stress testing while electronic devices within the other block is inactive for burn-in stress testing. This may provide power management schemes for the burn-in stress testing. It may also align burn-in processes with technology scaling and alleviate problems with elevated leakage current. Burn-in stress testing may be performed on more than one functional block at a time depending on power limitations and burn-in duration and cost issues.

Figure 5:
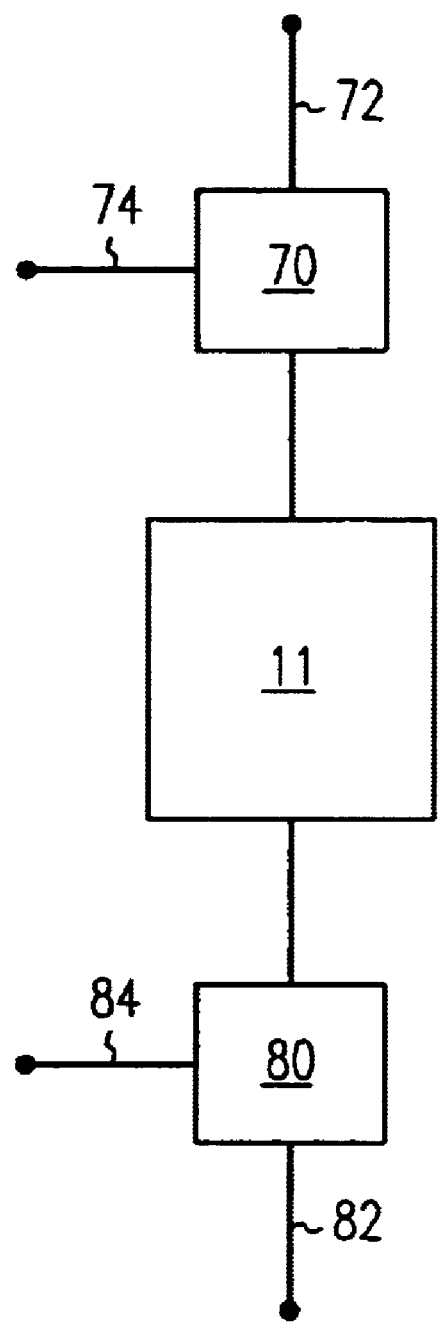
FIG. 5 illustrates sleeping transistors coupled around one partitioned block according to an example embodiment of the present invention.

As discussed above, sleeping transistors may be used to reduce leakage current of electronic devices within inactive blocks during burn-in stressing. The present invention is not limited to the embodiment of the sleeping transistors discussed above. FIG. 5 shows another example embodiments of the present invention in which two transistors 70 and 80 are coupled around one partitioned block according to the present invention. More specifically, transistor 70 is coupled between terminal 72 and the block 11 while transistor 80 is coupled between terminal 82 and the block 11. The transistors 70 and 80 may correspond to any of the following combinations: (1) two NMOS transistors having high threshold voltages; (2) two PMOS transistors having high threshold voltages; (3) a PMOS and an NMOS transistors having low threshold voltages; (4) two NMOS transistors having low threshold voltages; and (5) two PMOS transistors having low threshold voltages. Other embodiments for reducing the leakage current are also within the scope of the present invention.

While the invention has been described with reference to specific embodiments, the description of the specific embodiments is illustrative only and is not to be considered as limiting the scope of the invention. That is, various other modifications and changes may occur to those skilled in the art without departing from the spirit and scope of the invention.

What is claimed is:

1. A method of stress testing a chip comprising:
    partitioning said chip into at least a first block and a second block; and
    performing burn-in stress testing on electronic devices within said first block without simultaneously performing burn-in stress testing on electronic devices within said second block.

2. The method of claim 1, further comprising after performing burn-in stress testing on electronic devices within said first block then performing burn-in stress testing on said electronic devices within said second block without simultaneously performing burn-in stress testing on said electronic devices within said first block.

3. The method of claim 1, further comprising decreasing leakage current through said electronic devices within said second block while performing burn-in stress testing on the electronic devices within the first block.

4. The method of claim 3, wherein said leakage current is decreased through said electronic devices within said second block using transistors coupled to said electronic devices within said second block.

5. The method of claim 4, wherein said leakage current is decreased through said electronic devices within said second block by turning OFF said transistors coupled to said electronic devices within said second block.

6. The method of claim 1, further comprising identifying defective electronic devices on said chip based on said burn-in stress testing.

7. The method of claim 1, further comprising shifting values in a shift register from a first register to a second register, a signal corresponding to a value in said first register controlling a state of sleeping transistors coupled to said electronic devices within said first block.

8. The method of claim 7, wherein a signal corresponding to a value in said second register controls a state of sleeping transistors coupled to said electronic devices within said second block.

9. A method of performing burn-in stress testing on a chip comprising:
    partitioning said chip into a first block and a second block; and
    activating electronic devices within said first block for burn-in stress testing while electronic devices within said second block are inactive for burn-in stress testing.

10. The method of claim 9, further comprising performing burn-in stress testing on said activated electronic devices within said first block without simultaneously performing burn-in stress testing on said electronic devices within said second block.

11. The method of claim 10, wherein after performing burn-in stress testing on said activated electronic devices within said first block, said method further comprises activating said electronic devices within said second block for burn-in stress testing and deactivating said electronic devices within said first block for burn-in stress testing.

12. The method of claim 9, further comprising decreasing leakage current through said electronic devices within said second block while performing burn-in stress testing on the electronic devices within the first block.

13. The method of claim 12, wherein said leakage current is decreased through said electronic devices within said second block using transistors coupled to said electronic devices within said second block.

14. The method of claim 13, wherein said leakage current is decreased through said electronic devices within said second block by turning OFF said transistors coupled to said electronic devices within said second block.

15. The method of claim 9, further comprising identifying defective electronic devices on said chip based on said burn-in stress testing.

16. The method of claim 9, further comprising shifting values in a shift register from a first register to a second register, a signal corresponding to a value in said first register controlling a state of sleeping transistors coupled to said electronic devices within said first block.

17. The method of claim 16, wherein a signal corresponding to a value in said second register controls a state of sleeping transistors coupled to said electronic devices within said second block.

18. A device for performing burn-in stress testing on a chip comprising:
    a burn-in stress testing device to perform burn-in stress testing on electronic devices on said chip; and
    a control device coupled at least to said burn-in stress testing device, said control device to enable burn-in stress testing by said burn-in stress testing device on electronic devices within at least a first block of said chip without enabling burn-in stress testing by said burn-in stress testing device on electronic devices within a second block of said chip.

19. The device of claim 18, wherein said control device comprises at least a first transistor and a second transistor coupled to said electronic devices within said first block.

20. The device of claim 19, wherein said control device ensures said first transistor and said second transistor are in an ON state when burn-in stress testing is enabled on said electronic devices within said first block.

21. The device of claim 19, wherein said control device further comprises at least a third transistor and a fourth transistor coupled to said electronic devices within said second block.

22. The device of claim 21, wherein when said third transistor and said fourth transistor are in an OFF state, said third transistor and said fourth transistor reduce leakage current through said electronic devices within said second block.

23. The device of claim 19, wherein said control device further comprises a shift register having a first register and a second register, wherein a signal corresponding to a value in said first register controls a state of said first transistor and said second transistor.

24. The device of claim 23, wherein upon receiving a clock signal, said value in said first register shifts to said second register.

* * * * *